United States Patent [19]
Carter

[11] Patent Number: 5,419,278
[45] Date of Patent: May 30, 1995

[54] VAPOR EQUILIBRATION TRAY FOR GROWING PROTEIN CRYSTALS

[76] Inventor: Daniel C. Carter, 2209 Mallard La., Decatur, Ala. 35601

[21] Appl. No.: 249,277

[22] Filed: May 25, 1994

[51] Int. Cl.$^6$ ............................................. C30B 35/00
[52] U.S. Cl. .................................. 117/206; 117/901; 435/298
[58] Field of Search .................. 117/5, 200, 201, 202, 117/206, 901, 919; 422/99; 435/284, 298, 300, 301

[56] References Cited

U.S. PATENT DOCUMENTS

| | | | |
|---|---|---|---|
| 4,495,289 | 1/1985 | Lymen et al. | 435/284 |
| 4,917,707 | 4/1990 | Charamonte et al. | 117/206 |
| 5,096,676 | 3/1992 | McPherson et al. | 422/245 |
| 5,130,105 | 7/1992 | Carter et al. | 117/901 |
| 5,362,325 | 11/1994 | Shiraishi et al. | 117/201 |

FOREIGN PATENT DOCUMENTS

| | | | |
|---|---|---|---|
| 5032499 | 2/1993 | Japan | 117/206 |

Primary Examiner—R. Bruce Breneman
Assistant Examiner—Felisa Garrett
Attorney, Agent, or Firm—Larson and Taylor

[57] ABSTRACT

In accordance with the present invention, a vapor equilibrium apparatus for growing and screening suitable protein crystals is provided which consists of a plastic tray having a plurality of roughly cylindrical chambers that act as reservoirs for vapor equilibrating solutions and include a plurality of rib members having flattened upper ends recessed from the top of the chamber which form retaining levels wherein glass cover slips can be retained horizontally across the chambers in order to carry out the vapor equilibrating process. The upper ends can also be formed in a step-shaped fashion so as to provide multiple retaining levels of differing inner diameters which can retain glass cover slips of different sizes in the same chamber. The crystal growth tray of the invention is particularly advantageous in that it can be used in a variety of different methods for growing crystals using vapor diffusion or equilibration, and the device is sealable with clear plastic tape which avoids the problems associated with the prior use of silicon grease or oil. In addition, the tray of the invention allows for easy visual inspection and rapid removal of the crystals, and is highly effective in allowing the growth of large, high-quality crystals whose structure can be determined using state-of-the-art high resolution X-ray crystallography.

20 Claims, 4 Drawing Sheets

VAPOR EQUILIBRATION TRAY FOR GROWING PROTEIN CRYSTALS

FIELD OF THE INVENTION

The invention relates in general to a device for producing protein crystals, and specifically to an apparatus for growing protein crystals to a large size using a variety of vapor equilibration methods, including the hanging-drop and sitting-drop methods, which consists of a multi-chamber tray wherein each chamber contains a plurality of recessed rib members having flattened upper ends which act as retaining ledges for glass cover slips upon which the droplets containing the growing protein crystals are situated while vapor equilibration takes place.

BACKGROUND OF THE INVENTION

The field of X-ray crystallography involves the determination of the three-dimensional structure of the molecules that make up crystals using bombardment of X-rays and an identification of the crystal structure based on the diffraction of the X-rays by the crystal. Although X-ray crystallographic techniques have been known and used for years, recent advances in this field have allowed for the high-resolution determination of crystal structures to a far greater extent than that which has been previously achievable. In addition, the methodologies that support these studies, including computer graphics, x-ray imaging, computational methods, etc., have all advanced to a level which even furthers the ability of X-ray crystallographic methods to achieve high-resolution pictures of the molecular crystal patterns. In light of the recent advances in this field, X-ray crystallography has proven to be of enormous benefit in applications such as the designing drug-delivery systems (see, e.g., Bugg et al., *Scientific American*, December 1993, pp. 92–98), and its potential for further breakthroughs in this field is extremely high.

Despite these recent advances in this field, however, one problem that still remains arises because the protein crystals that can be analyzed using state-of-the-art high resolution X-ray crystallography must be grown to a sufficient size in the lab before a high-quality picture of their three-dimensional structure can be achieved. As a result, the high resolution imaging of crystals enabled by the advances in X-ray crystallography is still substantially limited by the inability to successfully grow on a consistent basis high-quality crystals of sufficient size for X-ray analysis. In order for protein crystals to be suitable for structural analysis via X-ray diffraction methods, crystals on the order of about 0.5 mm in diameter or greater must be obtained in order to achieve high resolution of the crystals with diffraction limits of about 3 angstroms or better. This has proved extremely inconvenient and difficult to accomplish on a consistent basis using techniques and crystallization trays known at present.

One of the main techniques available for growing crystals, known as the hanging drop vapor diffusion method, is a method wherein a drop of a solution containing the protein is applied to a glass cover slip and placed upside down in an apparatus such as a vapor diffusion chamber where conditions lead to supersaturation in the protein drop and the initiation of precipitation of the protein crystal. This method is usually troublesome and inefficient because current methods of employing this technique to achieve crystal growth are somewhat primitive, whether conducted manually or through automatic devices, and involve a series of adjustment of the conditions until a suitable experimental regimen is found. In the typical screening methods under this process, it is generally required that the lab technician vary the conditions of pH, buffer type, temperature, protein concentration, precipitant type, precipitant concentration, etc., for each set of experiments, and even adjusting for the myriad of conditions, often only minute samples of the protein can be studied at one time. These variables create an extensive and complex matrix of small experiments, with each experiment requiring another set of protein drops to be affixed to the glass cover slips and inverted and sealed in the vapor pressure chamber. As presently carried out using currently available devices, crystal growth methods such as the hanging drop method are tedious, time-consuming, and hard to carry out successfully and efficiently, and indeed often result in a large percentage of lost crystals and the need to remount the device for additional crystals.

Currently, there are three major sources for vapor diffusion screening trays currently on the market. The first of these screening trays is a conventional 24-chamber culture plate using a tray such as the one disclosed in U.S. Pat. No. 4,495,289 (Lyman et al.), which is generally known as the Linbro plate, and the process using this type of tray involves the tedious steps of inverting and sealing a protein droplet over each individual chamber. This method, which is still most commonly practiced in laboratories growing protein crystals, requires each of the chambers to be sealed tightly using a silicon grease applied to the top of the chamber, and this greasing step causes problems because it is messy and time consuming, and in addition creates problems when the crystal is removed from the greasy cover slip. Another problem resulting from the use of this device arises in that because it operates under conditions of high humidity, associated changes in ambient temperature result in a high percentage of lost runs due to the creation of condensation on the cover slip which dilutes the protein droplet.

The second major vapor equilibration method involves a device such as that depicted in U.S. Pat. No. 5,096,676 (McPherson et al.), which relates to a twenty-four chamber plate generally designed to hold the protein solution in a "sitting-drop" configuration which, unlike hanging-drop trays, allows a protein drop to sit on a central pedestal in the diffusion chamber while the top of the chamber is sealed using thin plastic material such as Mylar. The major problem with this apparatus and method is that the crystallization solutions as used in the McPherson tray are retained in a somewhat deformed plastic pedestal which presents serious limitations with regard to visually screening each experiment, and which interferes with examination of the crystals or other crystalline objects when using polarized light. This is a particular problem because the step involving inspection using polarized light is often the most important part of the screening process in that it is most often used to assess the success of the crystal growing method. Further, when using the McPherson device, the fragile crystals that are grown therein are difficult to see and manipulate because of the angle with which the probes must be manipulated under the microscope, which is necessitated because of the visibility limitations described above with regard to the chamber pedestal of this device. As a result of these drawbacks, the McPherson device results in a greater percentage of lost crystals, which thus causes the user to spend more time and effort in regrowing the crystals for diffraction experiments. Finally, this device also suffers because these trays are more difficult to re-use once each pedestal has been contaminated with protein solution, which often results in additional unwanted microbial growth.

The final method commonly used in encouraging protein crystal growth consists of another twenty-four chamber tray known as the Crystal Plate which is manufactured by Flow Laboratories of McLean, Virginia under license from the American Crystallographic Association. This device is a generally rectangular tray having square chambers which require square cover slips at the top and bottom of each chamber, and in which the reservoir solution is offset from the crystal viewing area. As with most of the prior art devices in this field, the Crystal Plate suffers from drawbacks such as the need to use silicon oil in order to seal both the upper and lower slip covers, which involves the messy and time consuming greasing process which affects the clean and safe removal of the crystal after growth has occurred.

In short, the Crystal Plate and the other prior art devices in this field suffer from a myriad of problems which have limited the use of high-resolution crystallographic techniques in protein analysis. It has thus been highly desirable in light of the recent advances in the field of X-ray crystallography to develop a highly efficient, simple and effective protein crystal growth tray which can be used with a variety of protein growing methods to create protein crystals of sufficient size and stability to be analyzed using X-ray crystallography, and yet which can also avoid the problems associated with the prior art devices.

SUMMARY OF THE INVENTION

It is thus an object of the present invention to provide a vapor diffusion or equilibrium chamber for use in growing high quality protein crystals which avoids the problems associated with prior art methods and devices.

It is also an object to provide a protein crystal growth apparatus which allows for high efficiency in growing protein crystals of sufficient size and stability so that they can be analyzed using presently available high-resolution X-ray crystallographic means.

It is still further an object of the present invention to provide a protein crystal growth tray which can be used with a variety of crystal growth methods to produce protein crystals of greater size and stability than those which can be produced using prior art devices.

It is still further an object of the present invention to provide a protein crystallization growth tray which is capable of providing large, high-quality protein crystals in a safe and efficient manner which allows for readily assessing the grown crystals with a minimum of effort and disturbance.

These and other objects are achieved in the present invention which provides a vapor diffusion protein growth chamber tray having a plurality of chambers each having a plurality of rib members having flattened upper surfaces positioned below the top of chambers which can retain glass cover slips in position horizontally across the chamber so that an appropriate vapor equilibration process can take place leading to the growth of sufficiently large protein crystals. The upper ends can also have a step-shaped configuration so that a plurality of retaining levels are formed by the rib members and cover slips having different diameters can be retained in the same chamber. Through the use of the present invention, a variety of methods can be used in order to achieve efficient and effective growth of high-quality protein crystals of sufficient size and stability so as to be appropriate for analysis using state-of-the-art X-ray crystallographic techniques to analyze the macromolecular crystal structure.

BRIEF DESCRIPTION OF THE DRAWING FIGURES

FIG. 4 is an enlarged fragmentary side view of the upper region of one of the rib members of the chamber of FIG. 3a.

DETAILED DESCRIPTION OF THE PREFERRED EMBODIMENTS

Figure 1:
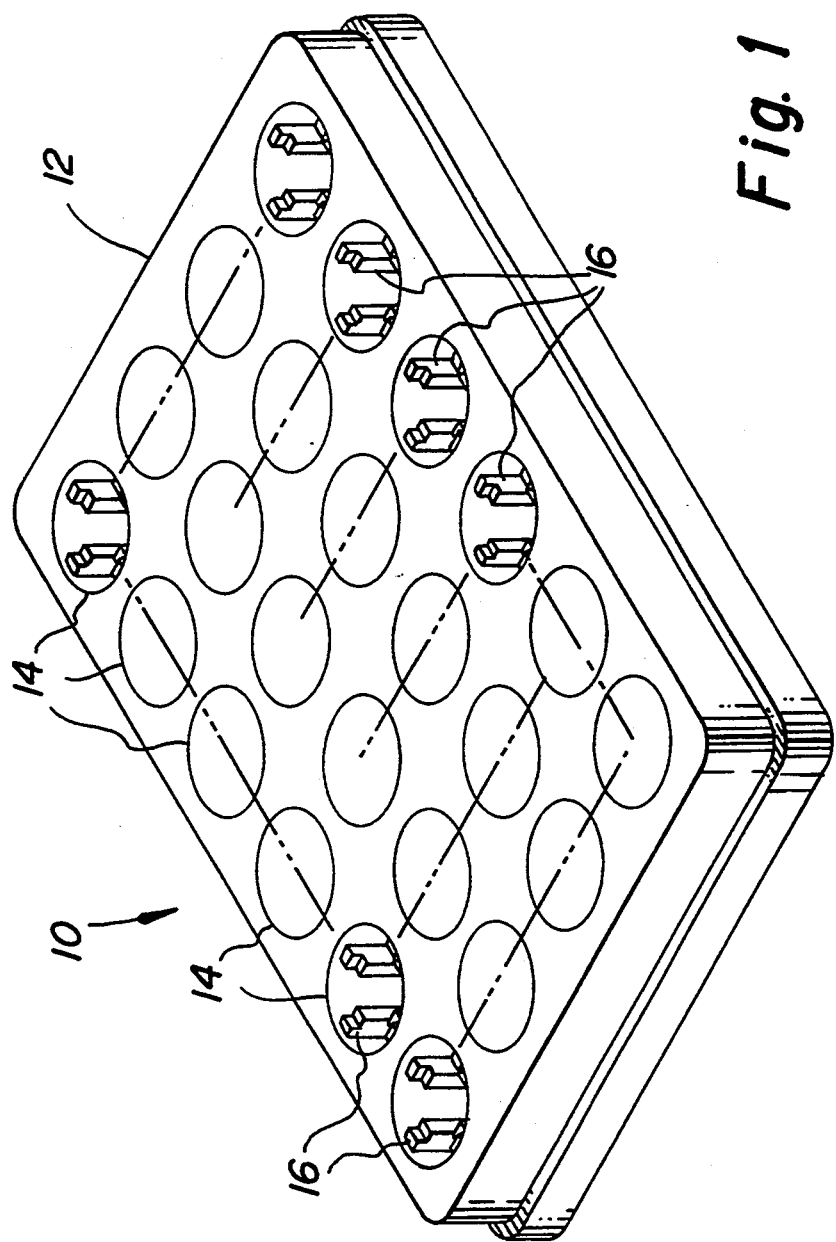
FIG. 1 is a side perspective view of the preferred embodiment of the present invention.

In accordance with the present invention, and as depicted in detail in the accompanying drawing FIGS. 1-5 wherein the same elements are represented by the same numerals in the different views, the protein growth apparatus 10 of the present invention comprises a generally rectangular tray 12 made of plastic or other suitable rigid material which contains a plurality of roughly cylindrical chambers 14 each of roughly the same size and shape. As in the configuration as observed in the drawing figures, the tray 12 ideally contains twenty-four of the chambers 14 in a four-by-six pattern. However, the precise number of chambers can vary, and the total number of chambers will be a matter of choice for the user. Where large numbers of protein crystallizations need to be carried out, a tray in accordance with the invention can be constructed to have a large number of chambers, but under these circumstances it will usually be preferable to employ a large number of separate trays having the twenty-four chamber configuration.

Figure 2A:
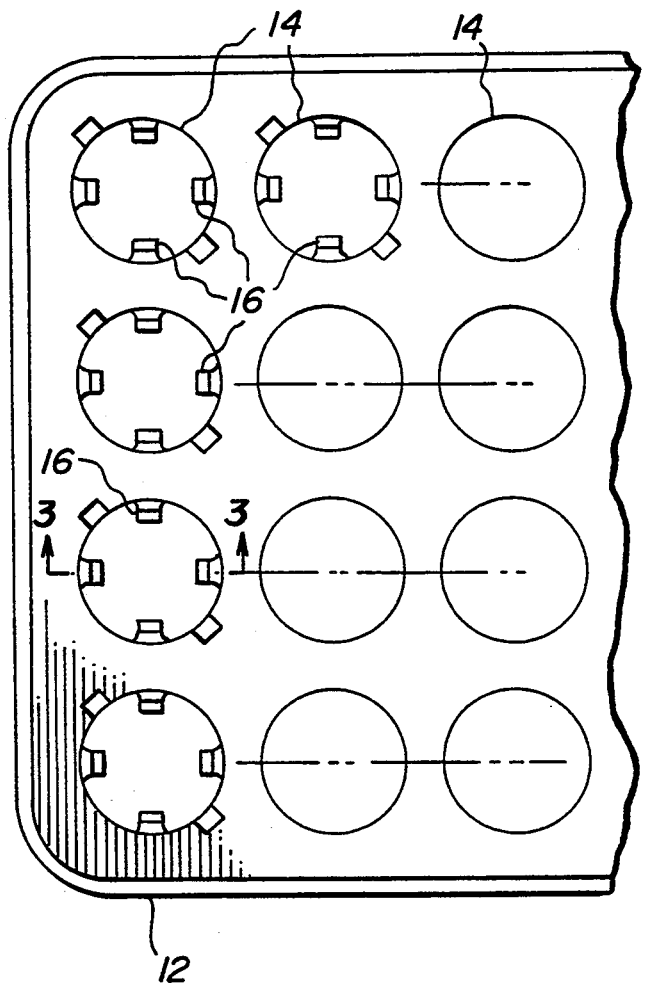
FIG. 2a is a top partial view of the preferred embodiment of the present invention.
Figure 3A:
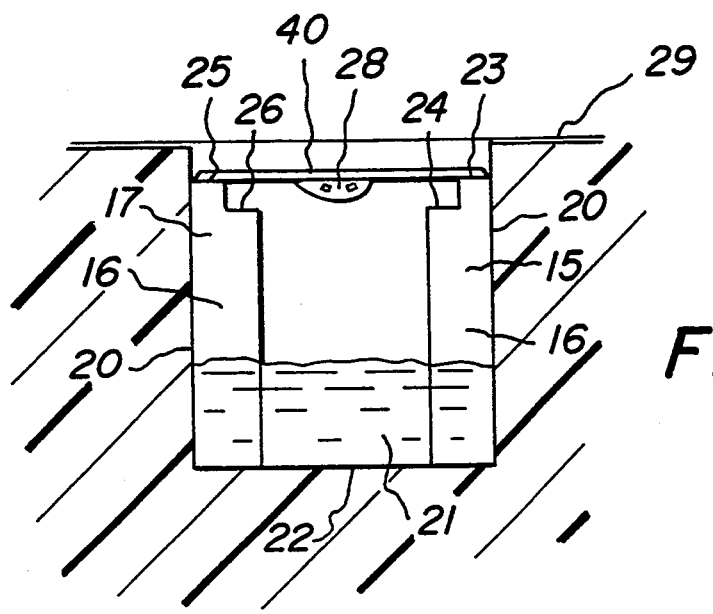
FIG. 3a is a side cross-sectional view taken along line 3—3 of FIG. 2a of one of the chambers in accordance with the present invention in use in a hanging-drop method of protein growth.
Figure 3B:
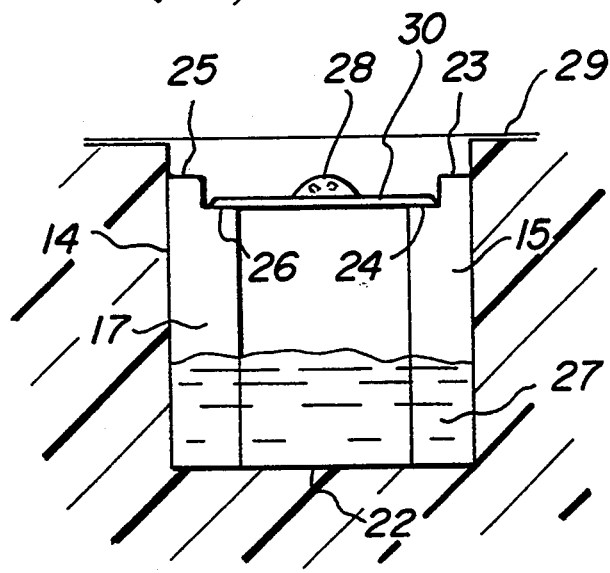
FIG. 3b is a side cross-sectional view of the chamber of FIG. 3a in use in a sitting-drop method of protein growth.
Figure 3C:
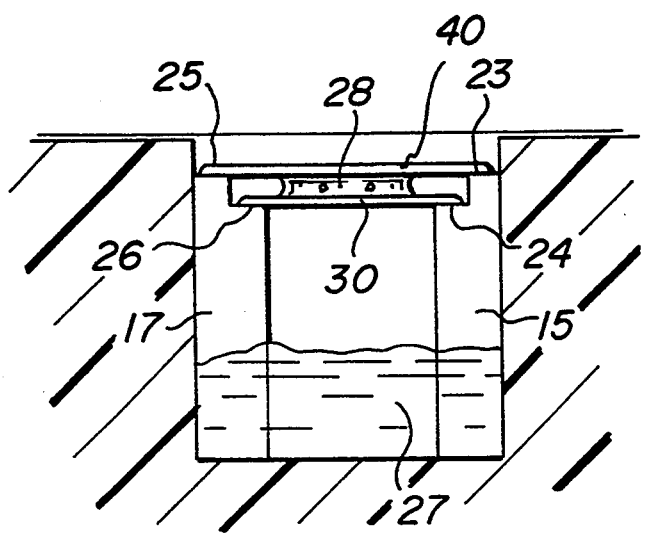
FIG. 3c is a side cross-sectional view of the chamber of FIG. 3a in use in a sandwich-drop method of protein growth.

As best observed in the cross-sectional views depicted in FIGS. 3a, 3b and 3c, which is taken along line 3—3 of FIG. 2a, each chamber 14 of the preferred tray 12 consists of a bottom wall 22 and roughly cylindrical side walls 20 which form a reservoir in which a suitable vapor equilibrating solution 27 can be retained. The chambers preferably feature a plurality of rib members 16 having a flattened upper end which is recessed from the top of the chamber and which will be positioned at the same height on the different rib members so as to form a retaining level upon which a cover slip can be supported when it is desired to carry out the equilibration process and grow protein crystals on the cover slip. In the preferred embodiment, the chamber 14 contains at least one pair of opposing rib members 16, such as ribs 15 and 17, which are disposed facing each other on opposite sides of the inner side wall surface 20 of chamber 14, as observed in FIGS. 1, 2a and 3a–3c. In the preferred embodiment, the opposing rib members 15 and 17 each feature a step-shaped upper end which preferably contains two steps, such as steps 23 and 24 on rib member 15 and steps 25 and 26 on rib member 17. It is also particularly preferred that the steps are located at the same height on the pair of opposing rib members so that they can provide two retaining levels having different diameters that are capable of snugly retaining in one chamber two cover slips (such as elements 30 and 40 in the drawing figures) having different diameters.

Figure 2B:
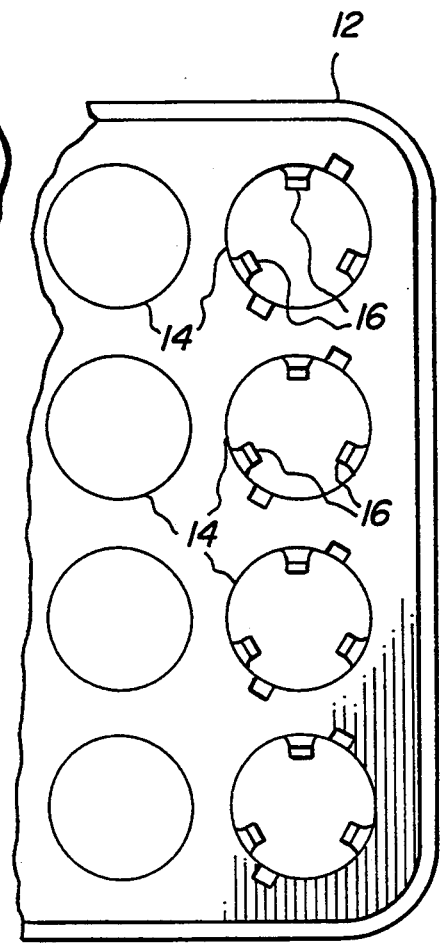
FIG. 2b is a top partial view of an alternative embodiment of the present invention.

In the particularly preferred embodiment, such as observed in FIG. 2a, the chambers 14 contain two pairs of opposing rib members 16 having step-shaped tops that are positioned so that the steps from all four rib members form the desired cover slip retaining levels. Alternatively, as depicted in FIG. 2b, the tray 12 of the present invention can be constructed with an odd number of rib members 16, and in such a case the rib members are ideally positioned along the inner wall of the chamber at the maximum distance from each other. In the configuration observed in FIG. 2b, the chamber 14 contains three rib members 16 which are disposed in a roughly triangular pattern wherein each rib member is spaced roughly 120° from the adjoining ribs. In all of these cases, the flattened upper end surfaces of the rib members form multiple layers for retaining cover slips of differing diameters in the same chamber.

In the preferred embodiment of the invention as observed in drawing FIGS. 3a–3c, the step-shaped top of each of the rib members such as ribs 15 and 17 contains two steps and thus forms two retaining levels of differing diameters. However, it is contemplated that the rib members can be constructed with more than two steps so that additional configurations for carrying out protein crystallization using more than two sizes of cover slips can be accomplished. In each of the alternate embodiments wherein multiple steps are desired, as in the preferred embodiment, the steps on the opposing rib members will be located at the same height so that they form multiple retaining levels of different diameters. In each of these configurations, it is preferred that the diameters of the retaining levels become progressively smaller as one goes from the upper levels to the lower levels, and each level should be constructed to retain a progressively smaller standard size of cover slip. It is also possible to construct the opposing rib members so that the top step is located at the same height as the top of the chamber. In such a configuration, a single step is disposed inside the chamber and a glass cover slip of appropriate diameter can be placed thereon.

Although the steps can be formed in any suitable dimensions, it is desirable that the diameters of the steps formed by the rib members be such that they match conventionally sized glass or plastic cover slips. In this regard, one particularly preferred configuration of the chamber 14 in accordance with the invention is constructed so that the upper level defined by steps 24 and 26 of the opposing rib members such as ribs 15 and 17, respectively, has a diameter of twenty-two millimeters so as to retain a similarly sized cover slip 40, and the lower retaining level formed by the steps 23 and 25 of the rib members is sized so as to snugly retain a cover slip having a diameter of eighteen millimeters which also corresponds to a standard cover slip size. In this preferred embodiment, the tray of the invention is constructed so that each chamber 14 is spaced at least about four to six millimeters away from each other chamber, with a center-to-center distance between chambers of from about 26 to 28 millimeters being optimal. When constructed to these dimensions, the tray of the invention provides an advantage over prior art crystal growth trays because more room is provided for the clear plastic tape cover, which will be discussed further below, and an improved vapor-impermeable seal of the chambers is obtained.

Figure 4:
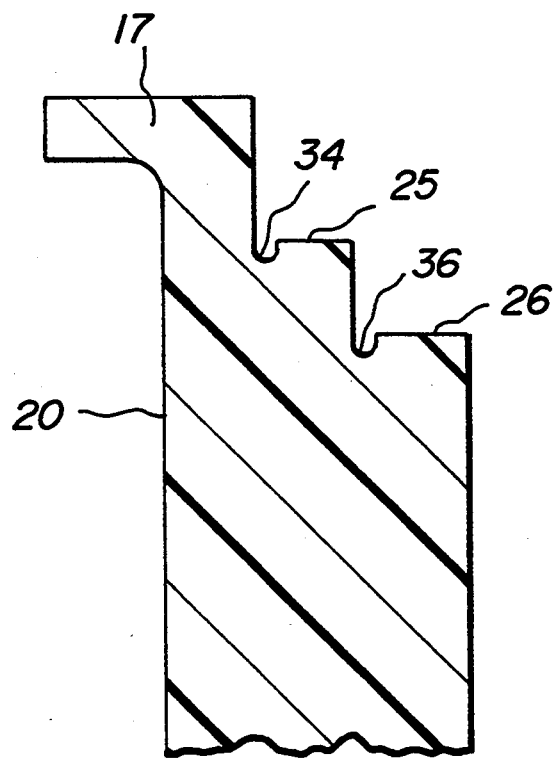

It is also preferred that the steps in the rib members 16 of the present invention be constructed with a notch at the intersection of each step with the side walls of the chamber, as observed in FIG. 4. As shown in this drawing figure for rib member 17, a notch 34 of generally semi-circular shape is formed at the side wall end of step 25, and notch 36 is located at a similar position on the lower step 26 of rib member 17. These notches can be used to further enhance the retention of certain cover slips on the cover slip retaining levels of the chambers of the invention.

In order to provide a suitable environment for the vapor equilibration process, the tray of the invention is preferably constructed of a suitable vapor-impermeable plastic material which is sealable by a number of suitable commercially available transparent tapes, such as clear plastic tape, and which when sealed provides a suitable reservoir for the equilibrating fluid used in crystal growth. It is preferred that the tray materials also be transparent so that visual inspection and analysis can be carried out in situ after the protein crystals have grown on the glass cover slips. Most preferably, the tray is constructed of a transparent moldable plastic material such as a polystyrene or a polycarbonate, however, a variety of other suitable materials such as glass or polysulphone will also be useful in constructing the tray of the invention, as will be readily obvious to one skilled in the art. The tape used to seal the tray of the present invention can be made of a number of suitable materials, but it is preferred that a clear synthetic plastic tape be employed. It is particularly preferred that the tape be constructed of a clear plastic such as polyester or polypropylene, and such tapes are available from the Elkay company of Shrewsbury, Mass. These tapes are generally preferred because of their superior sealing and thermal properties, and in addition employ as an adhesive the compound acroolefin which is a safe and biocompatible material.

In the preferred embodiment, the tray of the invention is formed using a unitary one-piece construction method such as injection molding or other thermoforming means wherein a suitable template receives the molten plastic to be formed into the tray of the invention. However, once again, there are many other suitable methods for forming the tray of the invention as would be well recognized by those skilled in the art.

The apparatus of the present invention allows for the screening of protein crystallization conditions in a more convenient and time efficient manner than has been previously the case with prior art trays such as the traditional hanging-drop tray produced by Linbro. In particular, the present apparatus easily interfaces with commercially available equipment and, unlike most prior art trays, does not require silicon grease or oil in order to effectively seal the chamber. In the present tray, sealing can be accomplished by using commercially available clear plastic tape. In the preferred embodiment set forth above, the tray 12 as depicted in FIGS. 1 and 2 has been particularly designed with an increased surface area which allows for a better vapor seal and allows far less communication between chamber reservoirs than prior art trays such as the one disclosed in U.S. Pat. No. 5,096,676 issued to McPherson et al. In addition, when sealed in the preferred manner using clear plastic tape, vapor condensation will be further inhibited because of the air gap formed between the tape seal and the cover slip. Moreover, a further advantage of the tray of the present invention is that the presence of vapor condensation does not ruin the particular experimental growth run because if condensation is observed, one can simply remove the tape and inspect and/or remove any desired crystals.

Figure 5:
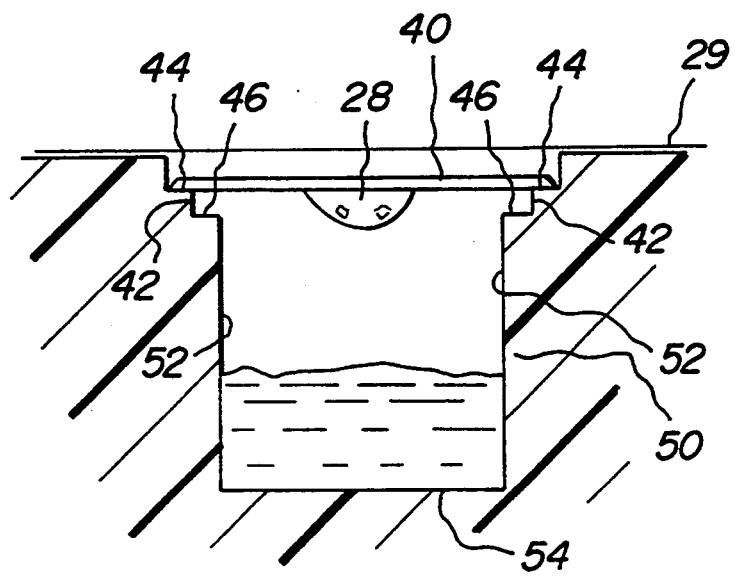
FIG. 5 is a side cross-sectional view of an alternative embodiment of one of the chambers of the present invention.

In an alternative embodiment of the invention, as depicted in FIG. 5, instead of ribbed members with steps providing ledges for the cover slips, a tray can be constructed wherein the chamber 50, having bottom wall 54 and side walls 52, has a step-like region 42 at the top of side wall 52 which in the same manner as the previous embodiments is designed to form multiple ledges for the retention of glass cover slips of different sizes which will be retained inside chamber 50 containing reservoir solution 27, and which can be sealed in place using clear tape 29 applied over the chamber opening. In the desired configuration, the step-shaped top 42 will provide at least two steps 44 and 46 which are integral with the side wall of chamber 50, and which can act as retaining ledges of different diameters for retaining cover slips of different sizes. This alternate embodiment, as shown in FIG. 5, is suitable for use in various methods of vapor diffusion crystal growth such as the hanging drop method which will be described further below.

The apparatus of the present invention can be used in several different methods of achieving protein crystal growth which involve vapor diffusion or vapor equilibrium. The techniques involved which make use of vapor equilibrium in obtaining protein crystal growth are well known in the art, and include a variety of techniques such as those described in McPherson, Preparation and Analysis of Protein Crystals (Wiley, N.Y., 1982), incorporated herein by reference. One of these well known methods is referred to as the "hanging-drop" technique which involves the placement of a small droplet of protein solution on a glass coverslip, which is then inverted over a well of suitable precipitating solution and sealed. The precipitation solution in the well or reservoir contains a precipitating agent which is also present at a lower concentration in the protein droplet, usually about half of the concentration in the well solution.

Using this method, since the well solution is initially at a lower vapor pressure than the protein droplet, evaporation proceeds at a rate fixed by the vapor pressure difference between the protein drop and the well solution, as well as the distance by which the vapor must diffuse. As evaporation from the protein droplet progresses, the protein solution becomes supersaturated with the protein, and under appropriate conditions of pH, temperature, etc., crystallization of the protein or macromolecule will begin to occur. Ideally, methods which slow the approach to critical supersaturation are advantageous in that they lead to the formation of crystals of larger size, such as described in Gernert et al., Analytical Biochemistry 168:141-147 (1988), incorporated herein by reference. As set forth in the Gernert et al. article, a typical protein droplet solution is formed from a 25 mg/ml lysozyme solution combined with 4% (w/v) NaCl in 0.1M sodium acetate buffer of pH 4.0 at 25° C., and the precipitating solution in this case would be comprised of a 4% NaCl solution. However, a number of suitable protein drop solutions and precipitating solutions can be employed using the apparatus of the present invention, as would be readily understood by one skilled in the art.

In a typical protein crystallization run using the tray of the present invention, a hanging-drop method, such as depicted in FIG. 3a, can be carried out by placing a droplet of a protein-containing solution 28 on a cover slip such as glass cover slip 40 which has a diameter of 22 millimeters and which fits snugly into the upper retaining level formed by steps 23 and 25 on the pair of opposing rib members 15 and 17, respectively. In one suitable example, a 20 μl protein droplet is used which comprises 10 μl of a 25 mg/ml lysozyme solution and 10 μl of 4% (w/v) NaCl in 0.1M sodium acetate buffer of pH 4.0 at 25° C. The glass cover slip and protein droplet is then inverted and placed on the upper retaining level formed by steps 24, and the cover slip is sealed into place by applying a tape sealant such as plastic tape layer 29 as observed in FIG. 3a. The cylindrical chamber 14 which is sealed has previously been filled with about one milliliter of precipitating well solution 27, such as 4% NaCl plus a precipitating agent which is also present in the protein droplet solution. In the preferred mode, the solution 27 at the bottom of chamber 14 will be at a lower vapor pressure than the protein droplet 28, and optimally the concentration of the precipitating agent will be about 50% lower in the protein drop than in the well solution 27. When in the configuration as shown in FIG. 3 wherein the tray of the invention is sealed with the protein droplet 28 in place on cover slip 40, which is inverted and retained on the upper retaining ledge formed by steps 23 and 25 of rib members 15 and 17, respectively, the evaporation of the protein droplet will proceed until supersaturation is achieved and crystallization of the protein or macromolecule will occur.

The present invention can also be used in a sitting drop method of vapor equilibration, and this configuration is shown in FIG. 3b of the drawings in which the protein droplet 28 is placed on cover slip 30 which is then placed directly upon the lower retaining ledge formed by steps 24 and 26 of the rib members 15 and 17, respectively, of chamber 14. After placing the drop on the cover slip and the cover slip on the retaining ledge formed by steps 24 and 26, the chamber including the precipitating well solution 27 is sealed by applying clear plastic tape 29 over the opening of chamber 12. In this sitting drop configuration, because of the presence of the rib members and the cover slip which form partial boundaries to vapor diffusion, there are deliberate restrictions in the vapor communication between the protein droplet and the reservoir which thereby slows the rate of equilibration of the protein solution. Under these conditions, there is generally a reduction in the number of crystal nuclei formed, and an increase in the size of the resulting crystals. As in the hanging drop method described above, by using the tray of the present invention to grow protein crystals via the sitting drop method, crystals of larger size can be obtained.

In a third general mode of operation of the tray of the present invention, cover slips 30 and 40 which have different diameters can be used at the same time in what is known as a "sandwich drop" configuration, as observed in FIG. 3c. In this sandwich drop configuration, cover slips of different diameters, such as 22 mm and 18 mm, are both used to surround a protein droplet 28 which is retained between the two cover slips 30 and 40. In the preferred mode of operation, the smaller cover slip 30 is placed onto the lower ledge of the chamber formed by steps 24 and 26 of opposing rib members 15 and 17, respectively. After the first cover slip is in place, a drop of protein solution 28 is placed on cover slip 30, the 18 mm cover slip. Next, the larger 22 mm cover slip 40 is placed in the chamber and positioned so that it will be retained by the upper ledge formed by steps 23 and 25 of the opposing rib members, and thus forms a "sandwich" wherein the protein droplet 28 is retained between the two cover slips. As in the previous embodiments, the chamber containing precipitating well solution 27 is sealed by means of plastic tape 29, and the vapor equilibration process is allowed to take place which results in the formation of protein crystals in protein droplet 28. In this third mode of operation, the sandwich pattern created by the two cover slips provides for much greater drop stability against mechanical disturbances and also allows for improved optical clarity for easier visual inspection of the protein drop because there is less distortion from drop curvature.

As used in all of these modes of operation, the present invention comprises a significant advance in the field of growing protein crystals of suitable size, stability and quality in that through the use of a device in accordance with the invention, suitable protein crystals can be grown using a variety of manual or automated methods in a simple and efficient manner. In general, the system of the present invention provides distinct improvements over the prior art in a number of ways, such as the ability of the crystals to be removed more easily from the present tray than in prior devices. This advantage results because the angle of incidence of the present tray that is required to manipulate the crystal under the microscope can be much shallower, and because with the use of clear plastic tape, the silicon grease or oil associated with most prior art methods can be eliminated. Thus, the present tray allows for easy and clean removal of the cover slips by removal of the plastic tape which allows better access to the crystals and less chance for contamination. When used in sitting-drop configuration, the glass cover slip does not have to be removed at all when manipulation of the crystals is desired.

In addition, a further advantage is presented in that the present device is more amenable to re-use after washing out the previous contents because the protein droplets are always placed on new glass cover slips, and because the device eliminates the need to use silicon grease which is extremely difficult to remove from the tray surfaces. Finally, the device of the invention is an improvement over previous crystal growth trays in that inspection of the grown crystals can be accomplished using polarized light in a manner that has been difficult or impossible to carry out using prior methods and apparatuses. In summary, the use of the present invention will allow for a wider variety of protein crystals and other macromolecules to be studied using state-of-the-art X-ray crystallographic techniques, which will enable further breakthroughs in the determination of crystal structure and allow for the development of safer and more effective delivery of drugs or other therapeutic compounds.

In light of the disclosure of the invention as set forth above, it is clear that numerous other objects and features of the invention that are inherent in the disclosure will be readily appreciated by those skilled in the art. In addition, it will be well recognized to one skilled in the art that numerous changes and modifications not specifically set forth can be made with regard to the embodiments described above without departing from the scope of the invention which is defined in the claims appended hereto.

What is claimed is:

1. An apparatus suitable for use in growing crystals via a vapor equilibration process wherein the crystals are grown to such a size that the crystal structure crystal can be analyzed using high resolution X-ray crystallographic techniques, said apparatus comprising:
   a. a tray containing a plurality of roughly cylindrical sealable chambers, said chambers having a bottom wall and side walls so as to be capable of providing a reservoir for a vapor equilibrating solution; and
   b. a plurality of rib members disposed along the inner surface of the side walls of said chamber, said rib members having at least one flattened upper surface which is recessed from the top of said chamber and which is positioned at the same height on different rib members so that the rib members form at least one cover slip-retaining level capable of retaining a cover slip when placed in roughly horizontal position across said chamber so as to allow a vapor equilibration process to take place.

2. An apparatus according to claim 1 wherein said upper surface of said rib members is step-shaped so as to provide at least two flattened surfaces disposed at the same height and in the same manner on different rib members so as to form at least two cover slip-retaining levels of different inner diameters in said rib members so that cover slips of different diameters can be positioned on said retaining levels horizontally across said chamber so as to allow a vapor equilibration process to take place.

3. An apparatus according to claim 2 wherein the inner diameters of said cover slip-retaining levels become progressively smaller from top to bottom so that the diameter of each lower level is smaller than the diameter of the retaining level above it.

4. An apparatus according to claim 1 wherein said plurality of rib members comprises at least one pair of opposing rib members.

5. An apparatus according to claim 1 wherein said plurality of rib members comprises two pairs of opposing rib members.

6. An apparatus according to claim 1 wherein said plurality of rib members comprises three rib members disposed along the inner side walls of said chambers and spaced apart from each other by roughly 120°.

7. An apparatus according to claim 1 wherein said tray contains twenty-four chambers.

8. An apparatus according to claim 1 wherein said chambers can be sealed using transparent tape.

9. An apparatus according to claim 8 wherein said transparent tape comprises a clear plastic tape.

10. An apparatus according to claim 9 wherein said clear plastic tape is comprised of a material selected from the group consisting of polyester and polypropylene.

11. An apparatus according to claim 1 wherein said tray is comprised of a clear moldable plastic.

12. An apparatus according to claim 11 wherein said tray is comprised of a material selected from the group consisting of polycarbonates, polystyrenes and polysulphones.

13. An apparatus according to claim 11 wherein said tray is formed via injection molding.

14. An apparatus according to claim 1 wherein said tray is comprised of glass.

15. An apparatus according to claim 1 wherein said tray is of one-piece construction.

16. An apparatus according to claim 2 wherein said chambers have two cover-slip retaining levels formed by the step-shaped upper ends of said rib members.

17. An apparatus according to claim 16 wherein the upper of said cover-slip retaining levels formed by said rib members has a inner diameter of 22 millimeters and the lower of said cover-slip retaining levels formed by said rib members has a inner diameter of 18 millimeters.

18. An apparatus suitable for use in growing crystals via a vapor equilibration process wherein the crystals are grown to such a size that the crystal structure crystal can be analyzed using high resolution X-ray crystallographic techniques, said apparatus comprising a tray containing a plurality of roughly cylindrical sealable chambers, said chambers having a bottom wall and side walls so as to be capable of providing a reservoir for a vapor equilibrating solution, said chamber side walls having step-shaped upper ends so as to form at least one cover slip-retaining level capable of retaining a cover slip placed in roughly horizontal position across said chamber so as to allow a vapor equilibration process to take place.

19. An apparatus according to claim 18 wherein said step-shaped upper ends form at least two cover slip-retaining levels having different diameters so that cover slips of different diameters can be positioned on said retaining levels horizontally across said chamber so as to allow a vapor equilibration process to take place.

20. An apparatus according to claim 19 wherein the inner diameter of each lower cover slip-retaining level is smaller than the inner diameter of the retaining level directly above it.

* * * * *